United States Patent [19]

Hughes et al.

[11] Patent Number: 4,497,849
[45] Date of Patent: Feb. 5, 1985

[54] PROCESS FOR POLYMER COATING ELECTRICAL CONDUCTORS

[76] Inventors: Howard C. Hughes, 105 Cedar St., Cornwall, Pa. 17016; Roy D. Bertolet, 653 W. Main St., Palmyra, Pa. 17078

[21] Appl. No.: 534,936

[22] Filed: Sep. 26, 1983

[51] Int. Cl.³ ............................................. B05D 5/12
[52] U.S. Cl. ................................. 427/120; 427/434.7; 427/388.5; 128/419 P; 128/784; 128/785; 128/786
[58] Field of Search ............ 427/117, 118, 120, 434.7, 427/388.5; 118/405; 428/379, 371, 425.8; 128/419 P, 784, 785, 786

[56] References Cited

U.S. PATENT DOCUMENTS

| 1,454,224 | 5/1923 | Schmidt | 427/434.7 |
| 2,349,951 | 5/1944 | Fuller et al. | 174/121 SR |
| 2,507,310 | 5/1950 | Lodge | 118/405 |
| 2,528,009 | 10/1950 | Lorch et al. | 427/120 |
| 2,919,213 | 12/1958 | Puppolo | 118/405 |
| 3,245,960 | 4/1966 | Curtis | 428/379 |
| 3,451,848 | 6/1969 | Stevens | 427/120 |
| 3,574,665 | 4/1971 | Basche | 427/358 |
| 3,840,384 | 10/1974 | Reade et al. | 427/120 |
| 4,022,933 | 5/1977 | Lee | 427/120 |
| 4,033,357 | 7/1977 | Helland et al. | 128/419 P |
| 4,112,952 | 9/1978 | Thomas et al. | 128/419 P |
| 4,194,462 | 3/1980 | Knowles | 427/434.7 |
| 4,237,251 | 12/1980 | Ishimaru | 428/425.8 |
| 4,246,299 | 1/1981 | Ohls | 427/163 |
| 4,289,138 | 9/1981 | Halvorsen | 128/419 P |
| 4,312,798 | 1/1982 | Kovacs | 428/425.8 |
| 4,394,866 | 7/1983 | Hughes | 128/419 P |

FOREIGN PATENT DOCUMENTS

1318043/24-7 10/1970 U.S.S.R. ............................ 427/120

OTHER PUBLICATIONS

Braunwald et al., Surgery, vol. 58, No. 5, pp. 846-850, Nov. 1965.

Primary Examiner—Richard Bueker
Attorney, Agent, or Firm—Kerkam, Stowell, Kondracki & Clarke

[57] ABSTRACT

A process for polymer coating electrical conductors comprises dissolving a polymer in a volatile solvent to provide a solution of the polymer. The solution is maintained in a container provided with an outlet orifice at its lower end. The conductor to be coated is drawn through the solution and out of the bottom orifice which is sized to receive the conductor and the desired wall thickness of the coating. After the coated conductor leaves the orifice, it is passed through a heating chamber to evaporate the volatile solvent.

2 Claims, 1 Drawing Figure

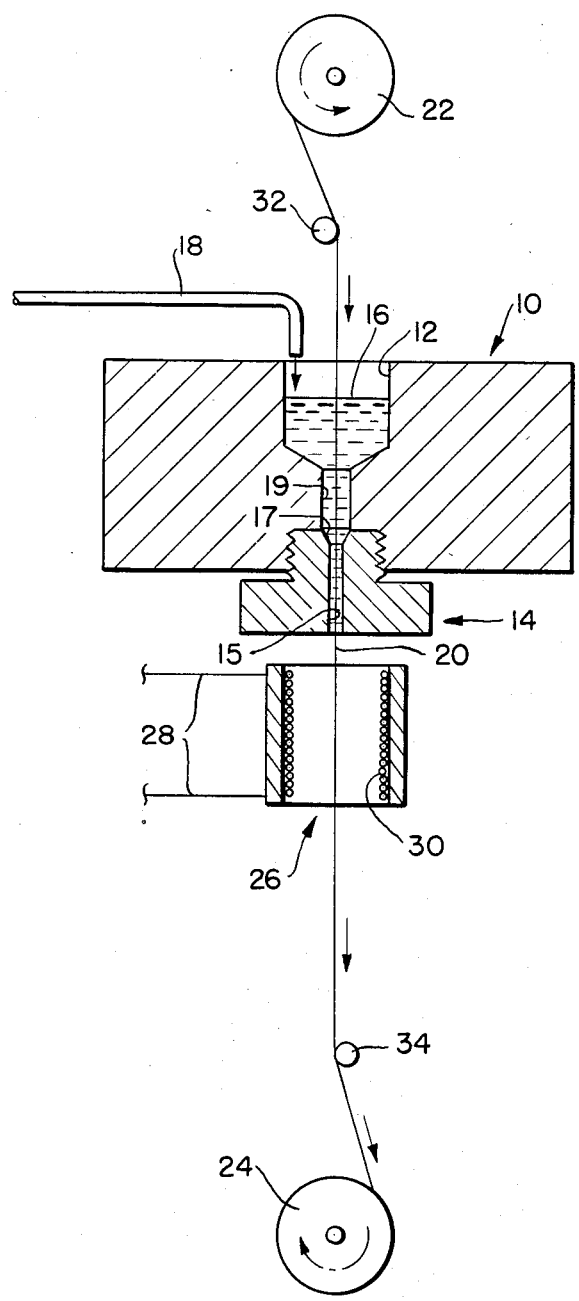

PROCESS FOR POLYMER COATING ELECTRICAL CONDUCTORS

This application is a continuation of Ser. No. 328,536, filed Dec. 8, 1981, and now abandoned.

TECHNICAL FIELD

This invention is a process for coating metallic electrical conductors with an adherent polymer coating whereby a wire or a plurality of wires may be rapidly provided with a coating, which may be only a few one-thousandths of an inch thick, to achieve a uniform and a smooth defect-free finish.

BACKGROUND OF THE PRIOR ART

The present state-of-the-art in coating wires or other materials with polyurethanes generally involves the use of one of several methods. The most commonly employed methods involve the use of extrusion or coextrusion techniques. In the extrusion technique, a tube is made for the wire to be coated through which the wire can later be slipped. In coextrusion, the urethane material is applied directly to the wire being covered. Both of these methods involve the use of heat to melt the polymer and high pressure to push the rather highly viscous material out of the extrusion orifice. These processes have limitations in that the thickness of the urethane coating being applied must be relatively great to achieve uniformity and a smooth defect-free finish. Therefore, such techniques are not very useful when one wants to apply a coating only a few one-thousandths of an inch thick since close tolerance between orifice and wire diameters is required.

The urethanes are also adaptable to vacuum and injection molding systems. Again, like extrusion, high temperature melting is required and the adaptability of such techniques for small wire coating is severely limited.

Another technique called "lacquering" is used much less commonly for coating wire or other materials. In this technique, the urethane is dissolved in a volatile solvent and then the resultant solution is sprayed on the object to be coated. Alternately, the object is dipped into the solution for coating much as one would make candles. The solvent is then evaporated at temperatures up to 200° C. leaving an adherent film of urethane to harden on the surface. This latter technique is disadvantaged since the process is slow and provides only limited production possibilities. In addition because the urethane lacquers are quite thin when applied they tend to run off or sag on the surface to be covered.

BRIEF SUMMARY OF THE INVENTION

This invention is directed to a new vertically oriented solvent type coating technique to produce a uniformly thin coating of, for example, segmented polyurethane on a wire or wires. The invention may be generally defined as a process for polymer coating electrical conductors comprising the steps: dissolving a polymer in a volatile solvent to provide a solution of the polymer, maintaining a pool of the solution in a container, providing an outlet orifice in a lower wall of the container sized to receive the conductor and a film of the solution of the desired thickness, threading the conductor through the container and out of the orifice, causing relative vertical motion between the container and the conductor and directing the conductor after passing through the orifice through a heated chamber to evaporate the volatile solvent.

BRIEF DESCRIPTION OF THE DRAWING

The invention will be more particularly described in reference to the drawing diagrammatically illustrating one form of apparatus for carrying out the process of the invention.

DETAILED DESCRIPTION OF THE INVENTION

Referring to the drawing 10 generally designates a combination reservoir 12 and die 14. The reservoir 12 receives a solution of a solvent and a polymer designated 16. The depth of the solution 16 is maintained in the reservoir via a conduit 18 connected to a source of the polymer solution not shown.

The outlet or orifice of interchangeable die 14, from the bottom of the reservoir 12, is sized to freely receive a metallic conductor 20. The diameter of the opening 15 in the die 14 is also such that the desired coating thickness of the polymer solution 16 is permitted to pass through the opening together with the conductor 20.

As shown in the drawing when the opening 15 in the die 14 is smaller than the maximum orifice size the die is beveled as at 17 to match the size of the bore 19 in the lower end of reservoir.

The conductor 20 is supplied from a reel 22 thereof and is taken up on a reel 24 after having passed through a heater 26 connected to a source 28 of electrical current employed to energize the heating coils 30 mounted within the heater 26. In the illustrated form of the invention, reel 24 is a driven reel to provide the force for causing the conductor 20 to pass through the solution of the polymer 16 through the orifice 14 and through the heater 26. While relative motion between the conductor 20 and the combined die and reservoir 10 is brought about by motion of the conductor, it will be recognized by those skilled in the art that the heater 26 and combined die and reservoir 12 may be urged upwardly while the conductor is maintained stationary.

As hereinbefore set forth, the process of the invention involves a form of urethane lacquering with orifice coating to produce a uniformly thin coating of segmented urethane. In particular, a polyether or polyester polyurethane could be used equally well with this technique.

In order to carry out the present invention, the urethane solid is dissolved in a suitable solvent such as dimethylacetamide or dimethylformaide. Other urethane solvents, however, will work equally well. The solution 16 is made to the desired thickness or viscosity by mixing the proper proportions of solvent to solids. In general, 10–30% weight/volume of polymer should be suitable for most applications. Once dissolved, the solution 16 may be filtered to remove impurities or dyes may be added to color. The apparatus for carrying out the process, as described hereinbefore, consists basically of an orifice 14, reservoir 12 and a method for moving the wire 20 through the solution 16 and a means 26 of drying the coated wire.

The wire 20 to be coated is a helically-coiled pacemaker lead which is stretched taught between the two reels and may be another wire down the center to act as a mandril and maintain a lumen. Other types of braided, twisted or monofilament wires will work equally well. The size of the orifice 14 is variable and can be changed depending upon the coating thickness and/or viscosity of the solvent being used. For example, to coat an 0.025 inch diameter wire with urethane and make the wall coating 0.005 inch thick, an orifice of 0.065 might be selected using a 25% solution of segmented polyether polyurethane. With this orifice, 0.025 inches of solvent dissolved polymer would be added to the outer surface of the wire. Since the solution used is 25% solid, when the solvent evaporates, approximately 0.005 inches of solid urethane would remain bonded to the wire. By using a thinner solution (less solids) or a smaller orifice, a thinner coating could be achieved. Conversely, a thicker coating could be made by using thicker solutions, larger orifices, or multiple coatings. These, of course, are not infinite, but are dependent on multiple factors including wire diameter, speed of coating, speed of drying and the type and properties of the polymer itself.

The depth and volume of the reservoir 12 depends, to some extent, on the speed of the coating process and/or the viscosity of the polymer. The faster the speed of wire movement and more viscous the polymer, the deeper the reservoir must be. This is because as the wire "drags" through the reservoir, surface tension created by the wire/polymer interface creates a funnel-like depression about the wire without the reservoir. If the level of the polymer is not deep enough, the coating material would not be in contact or be applied uniformly along the wire's length. A reservoir having a depth of about 0.25 inches has been found to be suitable where coiled wire is drawn through the reservoir at about 1 foot per minute.

The coating apparatus itself may be pulled up over the wire with the wire held stationary and firmly in place and this would be the preferred embodiment for coating pacemaker leads or other short lengths of wire. Alternately, as shown the reservoir and orifice may be fixed and the wire pulled through the reservoir and orifice. Guides 32 and 34 are placed above and below the reservoir 12 to assure that the wire passes through the center of the orifice 14.

After the wire passes out of the orifice 14, it is coated with the polymer and it must be dried. The faster it is dried, the less likely it will be for the polymer to run or sag. To evaporate the solvent, heat and dry air are appropriate. For the dimethylacetamide dissolved urethanes a temperature of approximately 150° F. should be used. The temperature should not, however, exceed the boiling point of the solvent (165.5°–166° F.) in order to prevent the formation of bubbles on the wire surface. The final drying temperature should not exceed 200° C., the dry sticking temperature of the polyether polyurethane.

The advantage of this technique lies in its ability to produce a very thin, accurate polyurethane coating. Large extruding orifice in relation to the resultant final desired coating can be used to provide a greater margin for slight "vibration error" without significantly affecting the finished coating thickness. Since the heat drying causes shrinkage of the urethane, the material will actually contract and adhere more tightly to the wire. In helical pacer leads, the urethane actually goes between the individual coils again adding strength and flexibility to the final product. In braided wires, the urethane could penetrate between individual wire, again adding strength and flexibility to the final product. Lastly, a much thinner coating can be applied as compared to conventional extrusion methods because the solution used to apply the urethane is less viscous than heat melted urethane.

The coating technique must be done vertically (as compared to the horizontal methods used for most extruding processes) to prevent running and/or sagging of the polymer solution which can occur when such thin, relatively nonviscous solutions are used in conjunction with a somewhat slower cure process. Furthermore, should additional thickness be desired for special purpose applications such as pacemaker lead wires, multiple coats can be applied, one on top of the other, until the desired wall thickness is achieved. By using this solvent dissolved urethane technique, each succeeding coat actually dissolves into and bonds with the preceding coat, therefore, a uniform thickness can be gradually built up on the wire rather than an onion-skinning effect that can occur through multiple coatings using the silicones.

It has been found that curing really occurs closest to the wire. This then results in the polymer being squeezed tighter and tighter against the wire forming a thicker adhesion to produce a coating that is both structurally and functionally one layer that cannot delaminate. The process can, therefore, apply very thick coatings as well as very thin coatings to wire which are not practical by extrusion techniques.

We claim:

1. A process for polymer coating metallic helically coiled electrical conductors for pacemaker leads with an adherent polymer coating consisting of the steps dissolving a polyether or polyester segmented polyurethane polymer in dimethylacetamide or dimethyl-formamide to provide a solution of the polymer, maintaining a pool of the solution in a container, a bottom outlet orifice in the container sized to freely receive the conductor and a film of the solution of the desired thickness, threading the helically coiled conductor to pass downwardly through the container, to effect coating of the helically coiled conductor with the solvent dissolved polymer as it passes through the orifice, adjusting the viscosity of the polymer/solvent solution to provide 10–30% weight/volume of polymer in accordance with the conductor diameter, speed of coating and orifice diameter to provide the desired coating thickness, directing the helically coiled conductor after passing through the orifice through a heated chamber heated to about 150° F. but less than about 165.5° F. to about 166° F. to evaporate the volatile solvent and dry the polymer on the helically coiled conductor.

2. The process defined in claim 1 further including repeating said process to provide multiple coats of the polymer on the conductors.

* * * * *